United States Patent [19]

Thorwarth et al.

[11] Patent Number: 4,908,938
[45] Date of Patent: Mar. 20, 1990

[54] METHOD FOR REPAIRING INTERCONNECT INTERRUPTIONS BY BRIDGING WITH CONGRUENT PREFORMS

[75] Inventors: Ruediger Thorwarth, Glonn; Siegfried Enzensberger; Rolf Diemann, both of Munich, all of Fed. Rep. of Germany

[73] Assignee: Siemens Aktiengesellschaft, Berlin and Munich, Fed. Rep. of Germany

[21] Appl. No.: 327,907

[22] Filed: Mar. 23, 1989

[30] Foreign Application Priority Data

May 26, 1988 [DE] Fed. Rep. of Germany ....... 3817900

[51] Int. Cl.$^4$ .............................................. H05K 3/00
[52] U.S. Cl. .................................. 29/846; 29/402.16; 174/68.5; 219/78.01; 219/86.21; 219/86.24; 219/119; 228/103; 228/119; 427/140
[58] Field of Search ................... 29/402.16; 219/78.01, 219/86.21, 86.24, 86.9, 119, 158, 162; 228/103, 105, 119; 350/523; 427/140; 174/68.5; 29/846

[56] References Cited

U.S. PATENT DOCUMENTS

| | | | |
|---|---|---|---|
| 3,964,666 | 6/1976 | Dinella et al. | 228/119 X |
| 4,259,367 | 3/1981 | Dougherty, Jr. | 427/140 X |
| 4,403,410 | 9/1983 | Robinson | 174/68.5 X |

FOREIGN PATENT DOCUMENTS

| | | |
|---|---|---|
| EP0043586A3 | 7/1984 | European Pat. Off. |
| 2251997 | 5/1974 | Fed. Rep. of Germany ...... 228/119 |
| 3025875A1 | 2/1982 | Fed. Rep. of Germany . |
| 2251997C3 | 3/1985 | Fed. Rep. of Germany . |

OTHER PUBLICATIONS

IBM Tech. Discl. Bull., vol. 5, No. 9, Feb. 1963, pp. 16–17, by Hairabedian.
"Open Conductor Repair for Glass Metal Module", by F. M. Tappen, IBM Technical Disclosure Bulletin, vol. 14, No. 10, Mar. 1972, p. 2915.
"A High-Speed Soldering System", Design Engineering, vol. 51, No. 4, Oct. 1980, Waseca, Minn., p. 23.

Primary Examiner—Carl J. Arbes
Attorney, Agent, or Firm—Hill, Van Santen, Steadman & Simpson

[57] ABSTRACT

A method for repairing interconnect interruptions. Faults at the interconnects occurring in manufacturing processes of printed circuit boards were previously repaired with suitable methods. The fashioning of the interconnects in a meander form and their miniaturization requires a completely new procedure. The dimensions of current interconnects amount, for example, to: width×height=70 $\mu$m×20 $\mu$m. For repairing such interconnects that are usually arranged in extremely tight proximity on an interconnect carrier, it is necessary to position preforms utilized for repair absolutely congruently on the interconnect interruption and to hold them until the joining zones are completely formed between the preform and the interconnect. This is achieved by use of an insulating foil having work windows and by use of a preform panel that contains a plurality of preforms. The preform is joined to the interconnect by resistance heating with a first electrode system and is separated from the preform panel with a second electrode system.

20 Claims, 2 Drawing Sheets

METHOD FOR REPAIRING INTERCONNECT INTERRUPTIONS BY BRIDGING WITH CONGRUENT PREFORMS

BACKGROUND OF THE INVENTION

The present invention is directed to a method for repairing fault locations in interconnects that are eliminated by bridging with congruent performs that are positioned uniformly and overlapping at both sides of the fault. In order to produce an electrically conductive and mechanically bearing connection, a resistance heating, i.e. a welding or a hard soldering, is typically used.

Further developments in electronic components and printed circuit boards have been accompanied by a miniaturization of the interconnects between the components. Repair methods are gaining in significance for the printed circuit boards and are becoming more expensive. Printed circuit board interconnects continue to be incapable of being manufactured fault-free. The demands made of the quality of such methods are constantly increasing.

Previous methods are disclosed, for example, in German Patent No. 22 51 998 or in German Published Application No. 30 25 875. Here, carrier bands that are plated with hard solder are treated, punched, picked up by an electrode and lowered onto the fault location. The congruent alignment occurs with optical aids. The disadvantages of the methods lie, first, in a plurality of work steps, whereby an alignment and positioning of a preform for repairing a defective interconnect is made more difficult, and, second, that the manipulation of correspondingly small repair parts with such methods is not possible due to the miniaturization of current interconnects whose width has been roughly halved to about 50 through 70 $\mu$m in comparison to the prior art and whose course is fashioned meander-like.

SUMMARY OF THE INVENTION

An object of the present invention is to provide a method for repairing interconnect interruptions by bridging with available congruent preforms with which a preform can be aligned congruent with the interconnect interrupt and the environment thereof and which can be mechanically and electrically joined to the interconnect with few work steps.

The method of the present invention is for repairing interconnect interruptions by bridging with congruent preforms and mutual joining by resistance heating. The method has the steps of:

placing an insulating foil, such as a polyamide foil, having a work window on the interconnect interruption such that the interconnect interruption appears at least approximately centrally in the work window; lowering a preform that is congruent with the interconnect interruption, the preform being held in a preform panel, onto the insulating foil and onto the interconnect by lowering the preform panel;

pressing the preform within the work window onto the interconnect with a first electrode system;

mechanically and electrically joining the preform to the interconnect at both sides of the interconnect interruption; and cutting off those part of the preform projecting beyond the work window of the insulating foil at the edge of the work window by resistance heating with a second electrode system.

The preform panels may contain a plurality of different preforms corresponding to interconnect configurations that occur on a printed circuit board. The selection and congruent positioning of the preform with respect to the interconnect interruption is monitored perpendicularly from above. A video camera is provided and is used for the selection and congruent positioning of the preform with respect to the interconnect interruption.

The method may further provide welding heads having at least three electrodes which are utilized in the first and second electrode systems, whereby each electrode is spring-seated in and of itself and the electrodes are electrically separated from one another. The pressing force of the electrodes can amount to a maximum of 0.6 N. An energy supply is connected to the first and second electrode systems and has short-term energy sources.

The invention is based on the perception that the comparison between preform and interconnect for identifying the congruency and the positioning of the preform on the interconnect at the location of the interruption must occur at the same location in order to eliminate work steps. To this end, a composite of a plurality of preforms, a preform panel, is used, this being positioned over the interconnect interruption after the application of an insulating foil having a work window on the interconnect such that the congruency between the preform and the interconnect can be identified by moving this preform panel relative to the interconnect for simultaneous observation with suitable optics. The lowering of the preform onto the interconnect with the preform panel can occur directly without intermediate steps. The joining event by resistance heating needed subsequent thereto and the parting of a selected preform from the preform panel are each carried out by a multiple electrode system.

An advantageous development of the present invention provides that a plurality of different preforms corresponding to the interconnect configuration occurring on an interconnect are contained within a preform panel. This has a very significant simplifying effect on the process of comparison between the preform panel and interconnect for the selection of a congruent preform.

In order to avoid a parallax error in the selection and in the congruent positioning of a preform relative to the interconnect interruption, it is advantageous to monitor this process perpendicularly from above.

This monitoring can occur with a microscope. However, an especially advantageous embodiment provides for the utilization of a video camera. Rather significant simplifications result in the manipulation with respect to the control by the present method.

The utilization of electrode systems that have at least three electrodes is very advantageous for the simple and fast implementation of the joining process and of the parting event. The set-down surfaces of the electrodes are adapted to the size of the preforms as well as to the size of the work window within the insulating foil and are adapted to the spacing of the interconnects on the printed circuit board and each electrode is resiliently seated in and of itself. The individual electrodes of a system, further, are electrically separated from one another, as a result whereof no short via the preform can occur.

Materials selection with respect to the insulating foil has shown that a foil of polyamide is best suited for the thermic, electric and mechanical stresses under consideration. Such a foil is temperature resistant up to 300° C.

It is extremely advantageous in order to achieve a qualitatively good repair location with respect to the electrical and mechanical properties to keep the thermic stress due to the application of energy during the resistance heating as low as possible. This can occur by using a short-term energy source that is connected to the electrode systems. The time of the resistance heating is thereby optimized by introducing a controlled short-term pulse, which is kept as minimal as possible.

In order to avoid damage to the extremely small interconnects, the individually spring-seated electrodes are applied with a maximum force of 0.6 N.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures in which like reference numerals identify like elements, and in which:

DESCRIPTION OF THE PREFERRED EMBODIMENT

Figure 1:
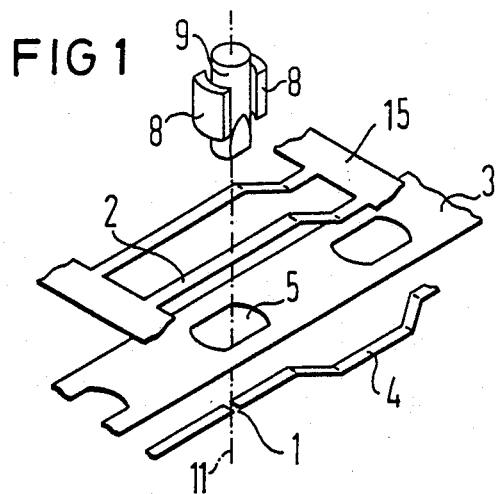
FIG. 1 is a perspective view showing the relative position of an interconnect interruption 1, a work window 5, a preform 2 and an electrode system 8, 9.

The positioning of the parts utilized during the method relative to an axis 11 oriented perpendicularly is shown in FIG. 1 and corresponds to the method steps of the present invention. An insulating foil 3 having a work window 5 is positioned above an interconnect 4 that has an interconnect interruption 1 at a defined location. A preform panel 15 having at least one preform 2 that is congruent with the interconnect interruption 1 is in turn positioned over this insulating foil 3. The precise alignment of the parts is established when the interconnect interruption 1 appears centrally in the work window 5 and the preform 2 is aligned congruent over the interconnect interruption 1 with overlapping symmetrically at both sides thereof. After the insulating foil 3 and the preform panel 15 having the preform 2 have been lowered onto the interconnect 4, the joining event between preform 2 and the interconnect 4 can be undertaken with the electrode system 8, 9. It should be noted that this method yields a rather specific advantage due to the holding of the preform 2 within the preform panel in that slippage between the individual parts is no longer possible between the process of alignment and lowering and the subsequent joining with resistance heating. The critical difference compared to previous methods is that the procedure of separating the corresponding preform 2 from the preform panel 15 is not carried out until after the joining event.

Figure 2:
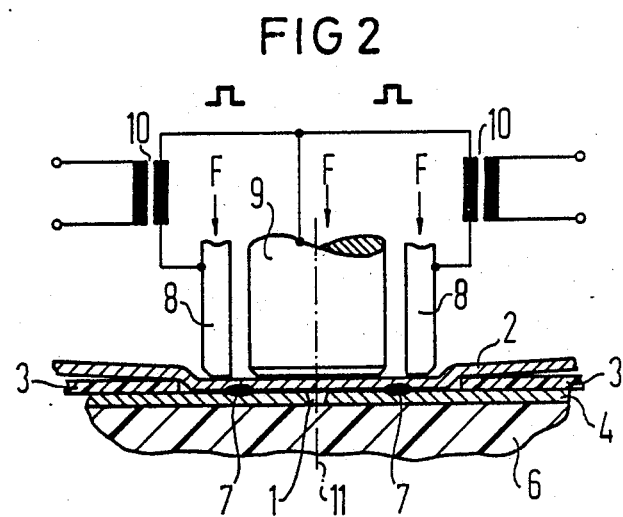
FIG. 2 shows a side view during a joining process with the electrode system 8, 9.

This joining event is shown by the arrangement of the individual parts in FIG. 2. The electrode system (in this case a welding head having three electrodes 8, 9) is placed centrally on the preform 2 corresponding to the axis 11. The position of the insulating foil 3 is taken into consideration by the symmetrical position of the work window 5 relative to the axis 11. The interconnect carrier 6 carries the interconnect 4 that has the interconnect interruption 1. The lens-shaped connecting zones 7 that arise due to the joining with resistance heating are placed approximately symmetrical relative to the interconnect interruption 1 and arise where the interspaces between the outside electrodes 8 and the inside electrode 9 are situated. The inside electrode 9 is cylindrically fashioned and has lateral flattened portions in its lower part, as shown in FIG. 1. As a result thereof, the set-down cross section of the inside electrode 9 is adapted corresponding to the shape of the work window 5, also shown in FIG. 1. This structural measure also guarantees protection of the neighboring interconnects whose spacings can be extremely small. The electrical supply of the electrode system 8, 9 has two short-time energy sources 10 that are indicated in FIG. 2 in the form of transformers. Brief pulses, vertical pulses in the ideal case, are supplied, their current intensity being, for example, 50 A with a voltage of 1 V and a pulse duration of 5 ms. Corresponding, a hard soldering or a welding can be optionally carried out. the force F indicated in the FIG. 2 that is produced by a spring amounts to a maximum of 0.6 N in the case of the inside electrode 9. The force F at the outside electrode 8 lies at about one-third or at one-half of the force that acts on the inside electrode 9. The electrode system 8,9 is removed after the implementation of the joining event.

Figure 3:
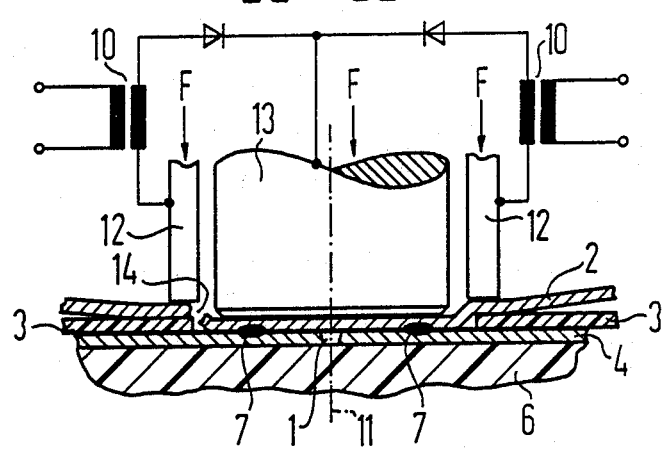
FIG. 3 shows a side view during a parting event with the electrode system 12, 13.

With respect to the interconnect carrier 6, the interconnect 4, the insulating foil 3 and the preform 2, the same structure is present in FIG. 3 as in FIG. 2. In this case, however, an electrode system 12, 13 is used that serves the purpose of parting that portion of the preform 2 from the existing repair material that lies within the work window 5 and is connected to the interconnect 4. It may be clearly seen that the outside electrodes 12 and the inside electrode 13 utilized in this case are dimensioned somewhat larger than the first electrode system 8, 9. The short-time energy sources 10 that are likewise utilized here are decoupled by two diodes (as shown in FIG. 3) and emit a short-time pulse in alternation, i.e. following one another. The alignment of this second electrode system 12, 13 is likewise undertaken centrally relative to the axis 11 and perpendicularly from above. The preform 2 can thus be cut from the preform panel 15 at the edge of the work window 5 within the insulating foil 3 by an energy pulse as set forth. The parting location 14 in FIG. 3 is indicated between the left-hand outside electrode 12 and the inside electrode 13. A time of about 300 μm is required for this parting event. The design of the electrode system has influence on the quality of the parting event, whereby a uniform parting for low energy output can be achieved by minimizing the distance between the outside electrodes 12 and the inside electrode 13 insofar as possible.

Figure 4:
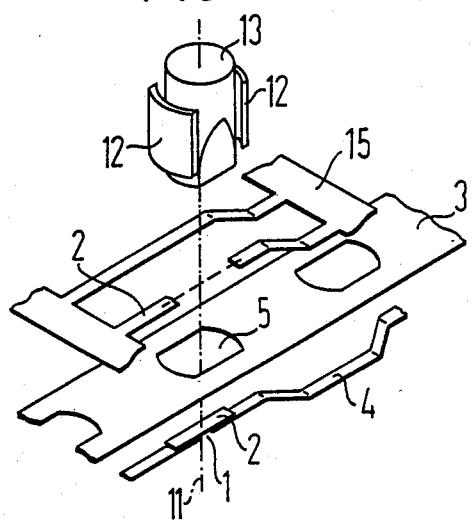
FIG. 4 is a perspective view showing the relative position of the various units after the repair process.

All parts relevant to the method are positioned relative to the axis 11 in FIG. 4, whereby the position of the second electrode system 12, 13 that is likewise perpendicular is shown here. The preform 2 within the preform panel 15 has been separated to form a specific part required in accordance with the dimensioning of the work window 5 and has been joined to the interconnect 4. Interruptions of up to 400 μm in length can thus be repaired.

The mechanical control for positioning the individual parts is so precise that the coordinates of, for example, the axis 11 can be precisely homed in on and the parts can be correspondingly aligned. The monitoring of the method occurs with appropriate optics, whereby the utilization of a microscope is disadvantageous insofar as the free working room between the object and subject is about 15 mm. The method can be handled considerably more simply when a CCD camera (charge coupled device) is utilized. The height of the interconnect 4, the height of the insulating foil 3 and the height of the preform 2 each amount, for example, to 20 μm. A region about 40 μm deep exists from the surface of the preform 2 to the surface of the interconnect 4. A CCD camera has a depth of field of about 300 μm and thus meets the optical precision and greatly facilitates the practical implementation of the method by providing the ability to observe the repair process on a picture screen.

The advantage of utilizing a three-electrode system as set forth is in the double function of the respective inside electrodes 9, 13. This is used in calibration with one outside electrode 8, 12, respectively, to produce a joining zone 7 or a parting location 14. The corresponding pulses of the short-time energy sources 10 are offset chronologically. In this case, controlled short-time energy sources are used wherein a rated/actual value comparison provides the control, i.e. the follow-up. The chronological offset o the pulses between an outside electrode 8, 12 and the inside electrode 9, 13, respectively, is needed so that the rated/actual value pick-up is unambiguous and mutual falsifications do not occur.

The physical structure of a preform 2 is composed of a carrier layer, usually of copper, and of a hard solder layer that is usually applied by plating. The preform 2 is put in place on the interconnect 4 with a hard solder layer.

The invention is not limited to the particular details of the apparatus depicted and other modifications and applications are contemplated. Certain other changes may be made in the above described apparatus without departing from the true spirit and cope of the invention herein involved. It is intended, therefore, that the subject matter in the above depiction shall be interpreted as illustrative and not in a limiting sense.

What is claimed is:

1. A method for repairing interconnect interruptions by bridging with congruent preforms and mutual joining by resistance heating, comprising the steps of:
    placing an insulating foil having a work window on the interconnect interruption such that the interconnect interruption appears at least approximately centrally in the work window; lowering a preform that is congruent with the interconnect interruption, the preform being held in a preform panel, onto the insulating foil and onto the interconnect by lowering the preform panel;
    pressing the preform within the work window onto the interconnect with a first electrode system;
    mechanically and electrically joining the preform to the interconnect at both sides of the interconnect interruption; and
    cutting off those parts of the preform projecting beyond the work window of the insulating foil at the edge of the work window by resistance heating with a second electrode system.

2. The method according to claim 1, wherein the preform is selected from various preform panels, whereby the preform panels contain a plurality of different preforms corresponding to interconnect configurations that occur on a printed circuit board.

3. The method according to claim 2, wherein the selection and congruent positioning of the preform with respect to the interconnect interruption is monitored perpendicularly to the printed circuit board from above.

4. The method according to claim 3, wherein a video camera is provided and is used for the selection and congruent positioning of the preform with respect to the interconnect interruption.

5. The method according to claim 1, wherein the method further comprises providing welding heads having at least three electrodes which are utilized in the first and second electrode systems, whereby each electrode is spring-seated and the electrodes are electrically separated from one another.

6. The method according to claim 1, wherein the insulating foil is a polyamide foil.

7. The method according to claim 1, wherein the method further comprises providing an energy supply which is connected to the first and second electrode systems and which has short-term energy sources.

8. The method according to one claim 5, wherein the pressing force of each of the electrodes amount to a maximum of 0.6 N.

9. A method for repairing interconnect interruptions by bridging with congruent preforms and mutual joining by resistance heating, comprising the steps of:
    selecting a preform from various preform panels, the selected preform being congruent with a predetermined interrupt having the interconnect interruption, the preform panels containing a plurality of different preforms corresponding to interconnect configurations that occur on a printed circuit board;
    placing an insulating foil having a work window on the interconnect interruption such that the interconnect interruption appears at least approximately centrally in the work window; lowering the selected preform that is congruent with the interconnect interruption, the selected preform being held in the preform panel, onto the insulating foil and onto the interconnect by lowering the preform panel; pressing the selected preform within the work window onto the interconnect with a first electrode system;
    mechanically and electrically joining the selected preform to the interconnect at both sides of the interconnect interruption; and cutting off those parts of the selected preform projecting beyond the work window of the insulating foil at the edge of the work window by resistance heating with a second electrode system.

10. The method according to claim 9, wherein the selection and congruent positioning of the selected preform with respect to the interruption is monitored perpendicularly to the printed circuit board from above.

11. The method according to claim 10, wherein a video camera is provided and is used for the selection and congruent positioning of the selected preform with respect to the interconnect interruption.

12. The method according to claim 9, wherein the method further comprises providing welding heads having at least three electrodes which are utilized in the first and second electrode systems, whereby each electrode is spring-seated and the electrodes are electrically separated from one another.

13. The method according to claim 9, wherein the insulating foil is a polyamide foil.

14. The method according to claim 9, wherein the method further comprises providing an energy supply which is connected to the first and second electrode systems and which has short-term energy sources.

15. The method according to claim 12, wherein the pressing force of each of the electrodes amount to a maximum of 0.6 N.

16. A method for repairing interconnect interruptions by bridging with congruent preforms and mutual joining by resistance heating, comprising the steps of:

placing an insulating foil having a work window on the interconnect interruption such that the interconnect interruption appears at least approximately centrally in the work window; lowering a preform that is congruent with the interconnect interruption, the preform being held in a preform panel, onto the insulating foil and onto the interconnect by lowering the preform panel;

pressing the preform within the work window onto the interconnect with a first electrode system;

mechanically and electrically joining the preform to the interconnect at both sides of the interconnect interruption;

cutting off those parts of the preform projecting beyond the work window of the insulating foil at the edge of the work window by resistance heating with a second electrode system;

providing welding heads having at least three electrodes which are utilized in the first and second electrode systems, each electrode being spring-seated and the electrodes being electrically separated from one another; and providing an energy supply which is connected to the first and second electrode systems and which has short-term energy sources.

17. The method according to claim 16, wherein the preform is selected from various preform panels, whereby the preform panels contain a plurality of different preforms corresponding to interconnect configurations that occur on a printed circuit board.

18. The method according to claim 17, wherein the selection and congruent positioning of the preform with respect to the interconnect interruption is monitored perpendicularly to the printed circuit board from above.

19. The method according to claim 18, wherein a video camera is provided and is used for the selection and congruent positioning of the preform with respect to the interconnect interruption.

20. The method according to claim 16, wherein the insulating foil is a polyamide foil.

* * * * *